United States Patent
Singhal et al.

(10) Patent No.: US 8,378,621 B2
(45) Date of Patent: Feb. 19, 2013

(54) INTEGRATED SYSTEMS FOR HARNESSING SOLAR AND WIND ENERGY

(76) Inventors: Tara Chand Singhal, Torrance, CA (US); Mukunda Singhal, Torrance, CA (US)

( * ) Notice: Subject to any disclaimer, the term of this patent is extended or adjusted under 35 U.S.C. 154(b) by 341 days.

(21) Appl. No.: 12/658,492

(22) Filed: Feb. 8, 2010

(65) Prior Publication Data
US 2011/0193512 A1    Aug. 11, 2011

(51) Int. Cl.
*H01M 10/44* (2006.01)
*H01L 31/042* (2006.01)

(52) U.S. Cl. ......................... 320/101; 136/246

(58) Field of Classification Search .................. 320/101; 136/246
See application file for complete search history.

(56) References Cited

U.S. PATENT DOCUMENTS

| | | | | |
|---|---|---|---|---|
| 4,229,941 A | * | 10/1980 | Hope | 60/641.15 |
| 4,246,042 A | * | 1/1981 | Knasel et al. | 136/246 |
| 4,361,758 A | * | 11/1982 | Rotolo | 250/203.4 |
| 4,945,693 A | * | 8/1990 | Cooley | 52/80.1 |
| 5,851,309 A | * | 12/1998 | Kousa | 136/248 |
| 6,239,353 B1 | * | 5/2001 | Hall et al. | 136/246 |
| 6,730,840 B2 | * | 5/2004 | Sasaoka et al. | 136/246 |
| 2007/0070531 A1 | * | 3/2007 | Lu | 359/851 |
| 2010/0263709 A1 | * | 10/2010 | Norman et al. | 136/246 |
| 2011/0062911 A1 | * | 3/2011 | Lloyd et al. | 320/101 |

* cited by examiner

*Primary Examiner* — M'Baye Diao
(74) *Attorney, Agent, or Firm* — Steve Roeder, Esq.

(57) ABSTRACT

An energy farm system that harnesses energy from the environment has an integrated energy collector that harnesses solar light radiation, solar heat radiation, and harnesses wind energy. Some embodiments of the collector may be used for powering lights on a pole, communication equipment outdoors, and be suitable for powering homes and buildings. The collector harnesses wind energy by a horizontal axis rotation wind mill, harnesses solar light radiation by using a system of lenses that focus light to the center to the photovoltaic cells, and harnesses solar heat radiation by using a system of lenses that focus heat to the center to a heat exchanger. The collector mounted on a pole receives solar energy from the sun rays, as the sun travels from east to west. The lens elements focus light and heat radiation towards the center of the collector to a solar cell array and a solar energy collector.

20 Claims, 7 Drawing Sheets

INTEGRATED SYSTEMS FOR HARNESSING SOLAR AND WIND ENERGY

CROSS REFERENCE TO RELATED APPLICATIONS

None

FIELD OF INVENTION

An energy farm, with solar energy collectors that use lenses that focus solar light and heat radiation towards the center of the collector to a solar cell array and heat exchanger element for harnessing solar energy. A horizontal axis windmill for harnessing wind energy may be integrated with the soar energy collector in some applications.

BACKGROUND

There are multiple ways of harnessing solar energy, for useful purposes. One of these ways includes arrays of solar cell panels mounted on the roof of buildings for harnessing solar energy as electric energy. Another way includes concentrator systems that concentrate solar energy for harnessing heat energy.

From the website of NREL, a new generation of power plants with concentrating solar power systems uses the sun as a heat source. The three main types of concentrating solar power systems are: linear concentrator, dish/engine, and power tower systems.

Linear concentrator systems collect the sun's energy using long rectangular, curved (U-shaped) mirrors. The mirrors are tilted toward the sun, focusing sunlight on tubes (or receivers) that run the length of the mirrors. The reflected sunlight heats a fluid flowing through the tubes. The hot fluid then is used to boil water in a conventional steam-turbine generator to produce electricity. There are two major types of linear concentrator systems: parabolic trough systems, where receiver tubes are positioned along the focal line of each parabolic mirror; and linear Fresnel reflector systems, where one receiver tube is positioned above several mirrors to allow the mirrors greater mobility in tracking the sun.

A dish/engine system uses a mirrored dish similar to a very large satellite dish. The dish-shaped surface directs and concentrates sunlight onto a thermal receiver, which absorbs and collects the heat and transfers it to the engine generator. The most common type of heat engine used today in dish/engine systems is the Stirling engine. This system uses the fluid heated by the receiver to move pistons and create mechanical power. The mechanical power is then used to run a generator or alternator to produce electricity.

A power tower system uses a large field of flat, sun-tracking mirrors known as heliostats to focus and concentrate sunlight onto a receiver on the top of a tower. A heat-transfer fluid heated in the receiver is used to generate steam, which, in turn, is used in a conventional turbine generator to produce electricity. Some power towers use water/steam as the heat-transfer fluid. Other advanced designs are experimenting with molten nitrate salt because of its superior heat-transfer and energy-storage capabilities. The energy-storage capability, or thermal storage, allows the system to continue to dispatch electricity during cloudy weather or at night.

There have also been wind farms that harness wind energy from the environment. Still, more efficient or versatile systems of harnessing solar and wind energy are required.

Hence it is objective of the preferred embodiments to have more efficient and versatile solar energy systems and also to have more efficient and versatile farms for solar and wind farm energy systems.

SUMMARY

An energy farm that can harness solar energy in the form of both light and heat and can also harness the wind energy in some embodiments is described. Features and benefits of such a triple energy farm that has a triple energy collector are described. Each energy collector collects up to three different forms of energy from the environment in a compact energy farm structure. In some embodiments such an energy collector may be used on the roof of buildings, in the open spaces around a building, for street lighting and for powering communication equipment and sensors in the field.

One of the benefits of the energy collector is that it uses fewer solar cells and they are protected from the environment. Longitudinal lenses arranged in a semi-circular pattern focus Sun's light towards the center of each energy collector to a photo-voltaic array of solar cells.

These longitude lenses also focus heat energy towards the center of each energy collector. Heat energy is channeled to a heat exchanger. As an alternative embodiment, semi-spherical geodesic dome structure with the structure surface studded with lenses that focus solar energy to the center of the structure may also be used.

In some embodiments of the energy collector, the energy collector may be equipped with a wind turbine that rotates in the horizontal axis and drives an electric generator in each energy collector to be able to harness wind energy. In the horizontal axis wind turbine, the turbine blades are vertically oriented to maximize capture of the wind energy.

Each triple energy collector is mounted on a pole or tower. Multiple energy collectors on their own poles and towers are used to create an energy farm. A central battery system stores charge and a DC/AC inverter convert the stored charge to high volt AC for distribution.

A triple energy farm using such energy collectors would minimize environmental impact and land footprint. These and other aspects of the embodiments are described herein with the help of the accompanying description and the drawings.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Introduction

Figure 1:
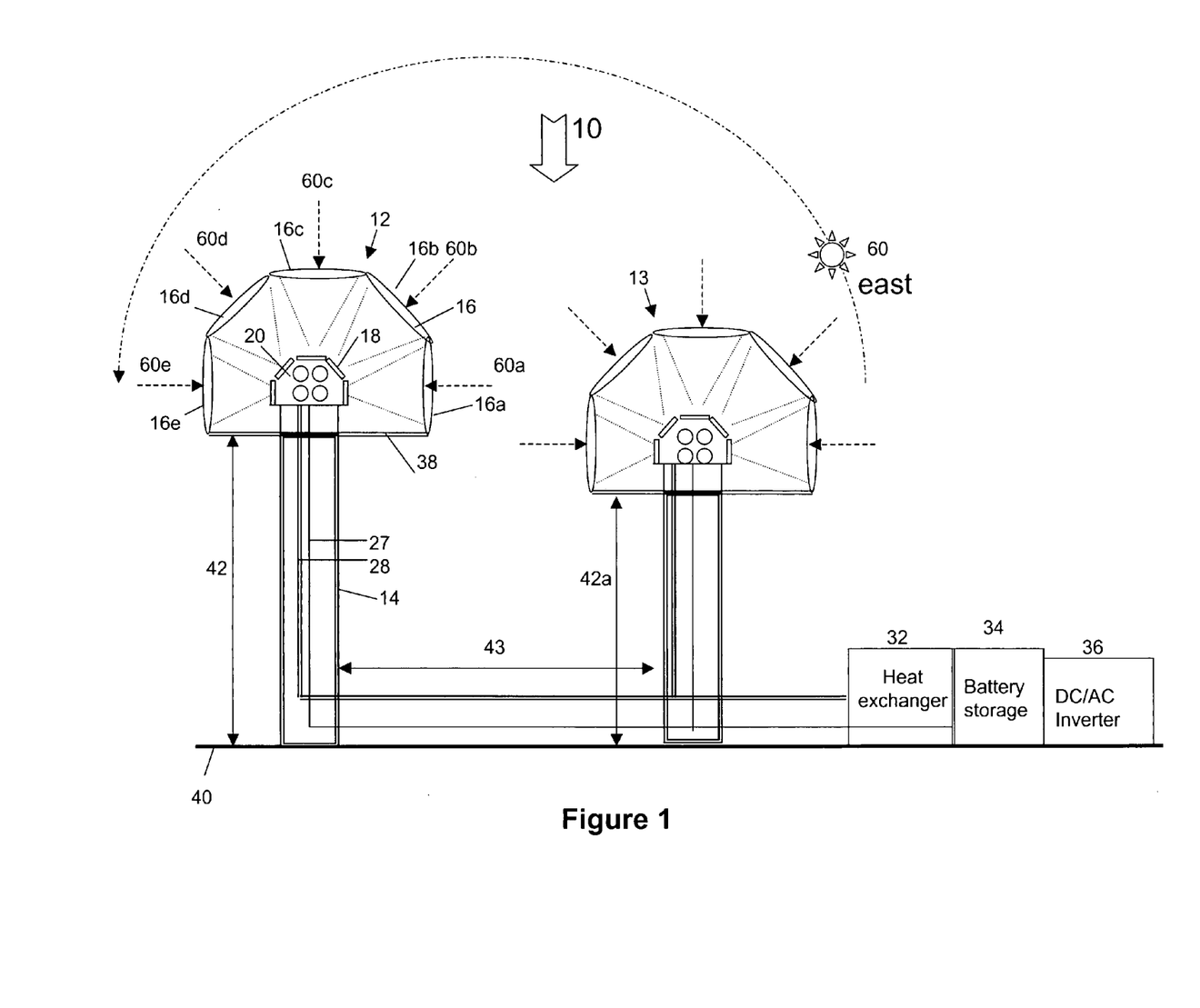
FIG. 1: A solar energy farm using solar energy collectors mounted on poles for harnessing solar energy.
Figure 3A:
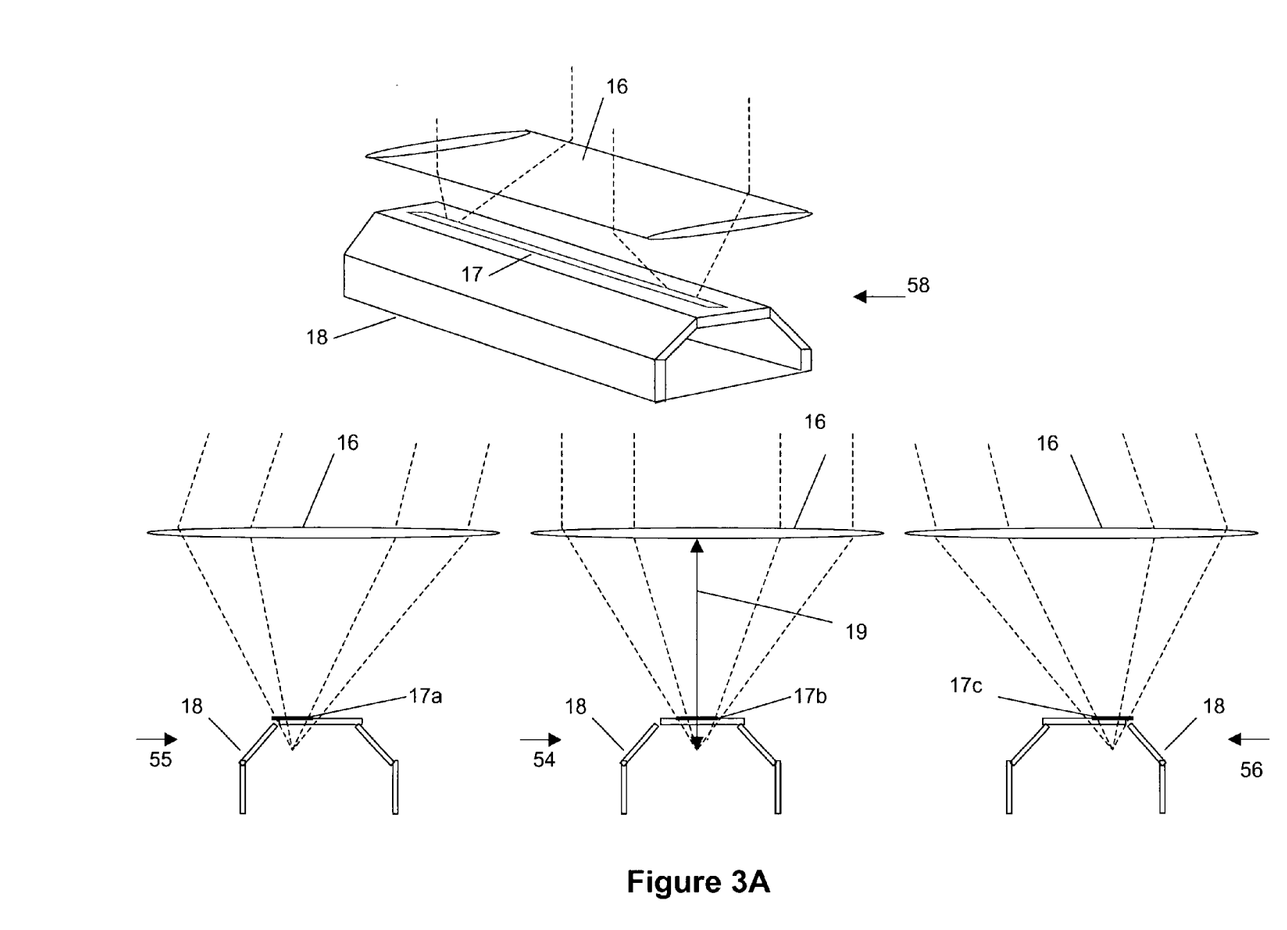
FIG. 3A: Perspective and side views of a longitudinal lens for focusing solar energy towards the center of the solar energy collector for harnessing solar light energy.
Figure 3B:
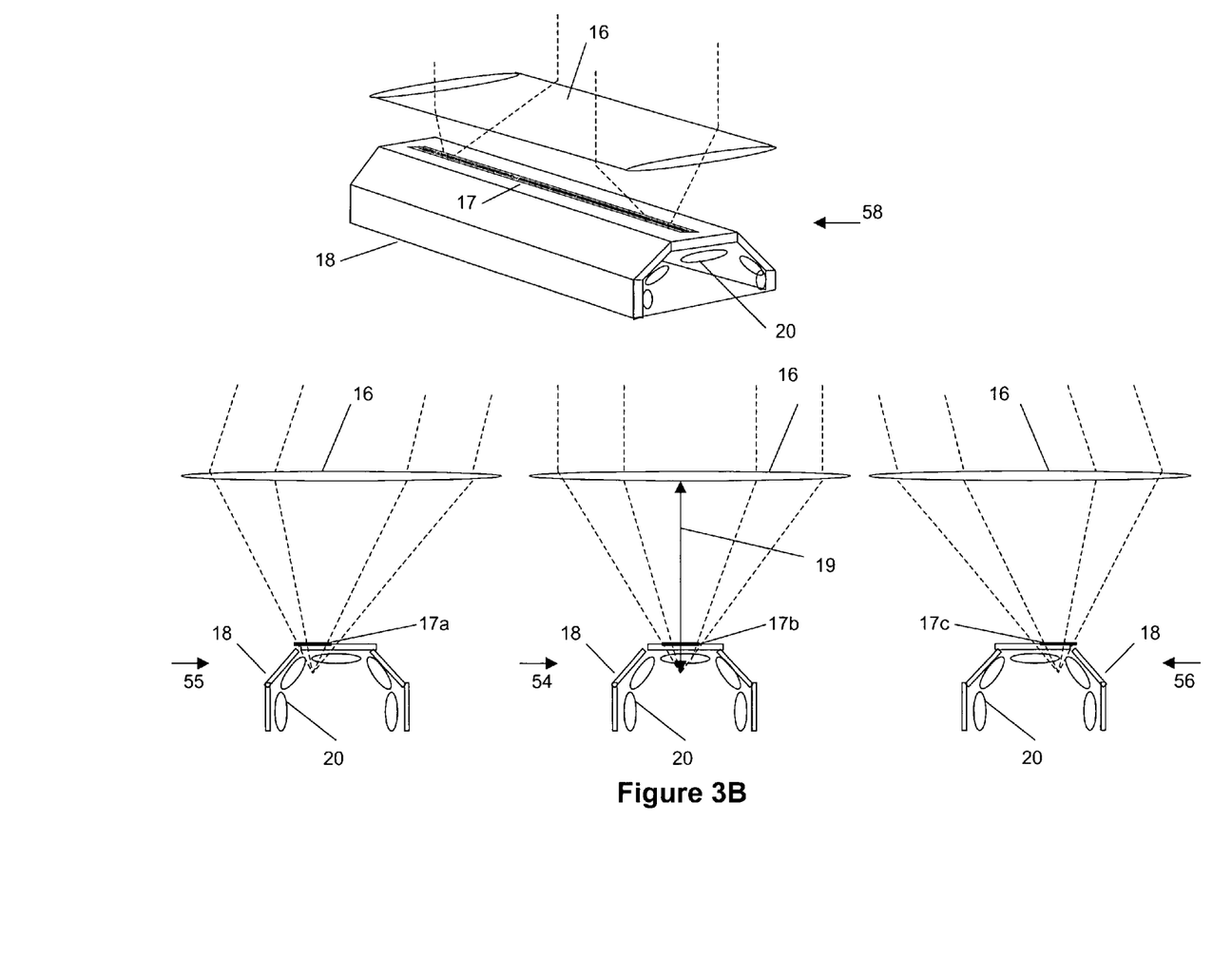
FIG. 3B: Perspective and side views of a longitudinal lens for focusing solar energy towards the center of the solar energy collector for harnessing solar heat energy.

As illustrated in FIG. 1, a solar energy farm 10 has a solar collector 12 mounted on a pole 14 at a height 42 from the ground 40. The solar collector 12 has longitudinal lenses 16 with five lens elements 16a, 16b, 16c, 16d, and 16e, arranged in a semi-circular structure, which receive solar energy from the sun rays 60*a*, 60*b*, 60*c*, 60*d* and 60*e*, respectively as the sun 60 travels from east to west. The use of the longitudinal lens 16 is illustrated later with reference to FIG. 3.

The solar collector 12 has semi-circular wrap around construction with lens elements 16*a* to 16*e* that focus light radiation to a solar cell array 18 at the center of the collector 12. The solar cell array 18 has five corresponding solar panels arranged at angles that parallel the five lens elements 16*a* to 16*e*.

Figure 5:
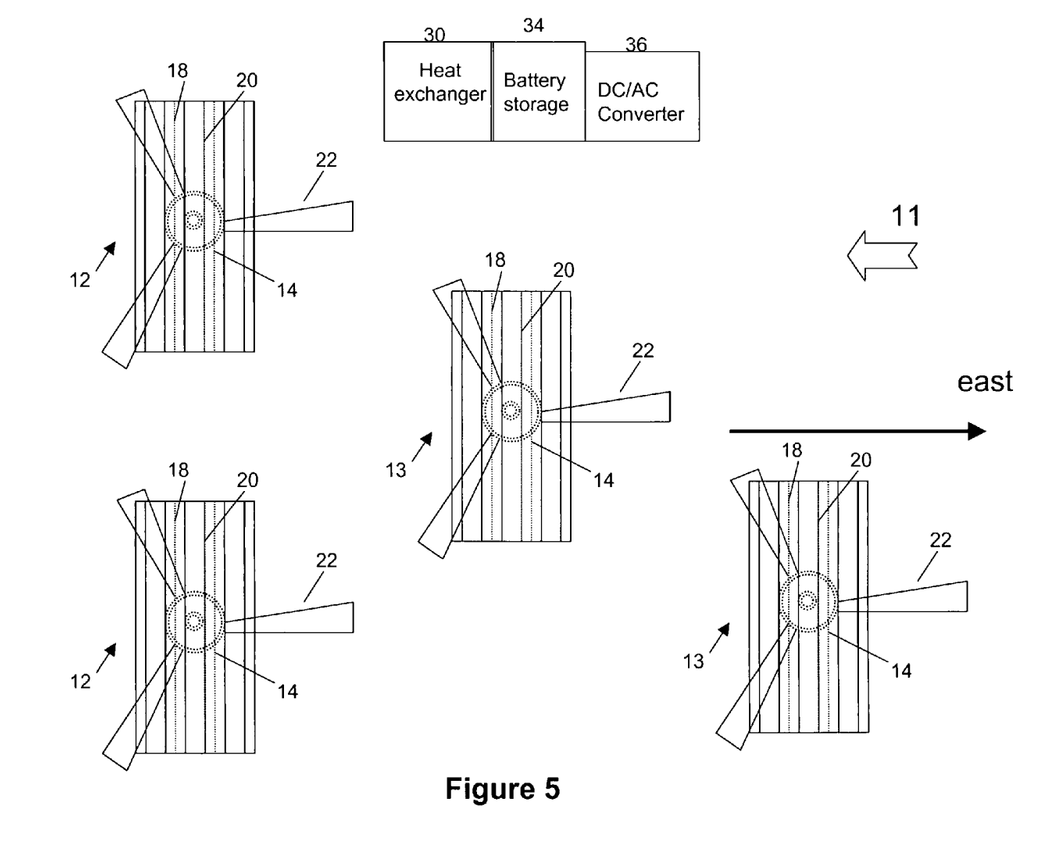
FIG. 5: Plan view illustration of a triple energy farm.

There is optionally also a means to collect solar heat energy using a system of tubes 20 that is positioned close to and behind the solar cell array 18 at the center of the solar collector 12 that heats a fluid in the tubes that are coupled with a heat exchanger 32 on the ground 40. The fluid tubes 28 and wire means 27 inside the pole 14 carry the solar energy out of the collector 12 to the heat exchanger 32 and battery storage 34. A DC/AC inverter system 36 may be used to convert stored DC current to high voltage AC for distribution There may be multiple solar collectors in an energy farm, where an adjacent solar collector 13, is the same as collector 12, but is placed at a height 42*a* from the ground 40 that is different than height 42 for the collector 12. The distance 43 between collector 12 and 13 and height 42*a* of the solar collector 13 with reference to solar collector 12 enables these solar collectors to be placed in a grid pattern. As illustrated in FIG. 5, a grid of solar collectors 12 and 13 may be used to collect large amount of solar energy that would be commercially useful for a variety of uses and applications.

Energy Collector 12

Figure 2A:
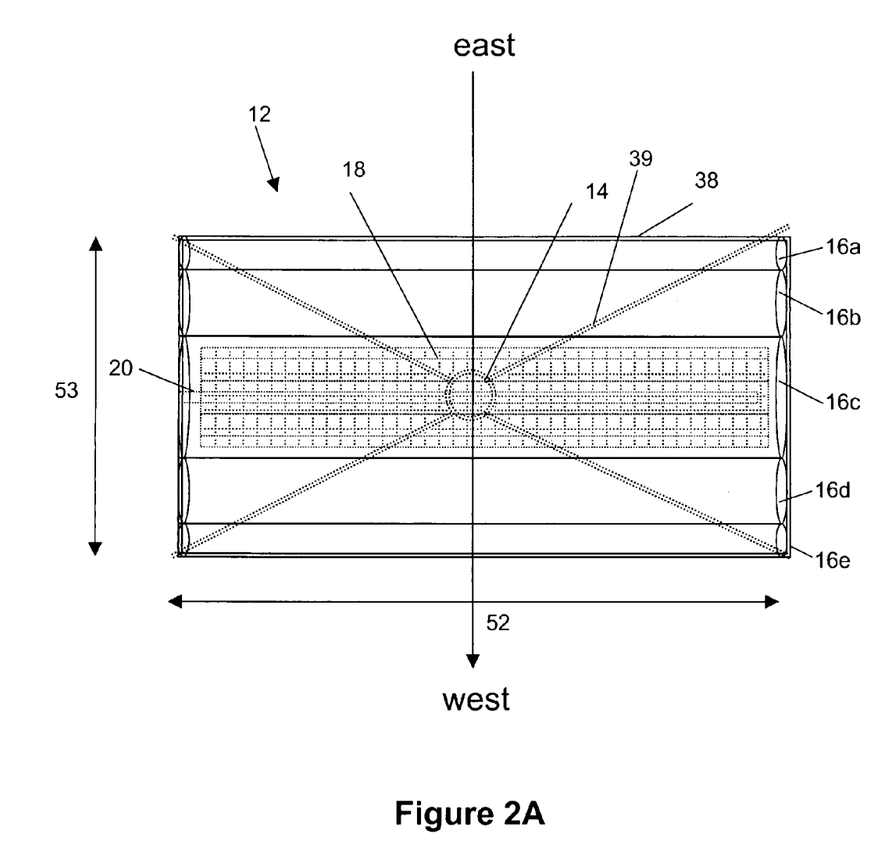
FIG. 2A: Structure details of a longitudinal solar energy collector.

FIGS. 2A, 2B and 3A and 3B illustrate details of the solar energy collector 12. As shown in FIG. 2A, the plan view from the top of the collector 12, the collector 12 has a structure 38 with support structure 39 and pole 14 that is used to hold in place the five longitudinal lens elements 16*a* to 16*e* in a semi-circular pattern with a solar cell array 18 inside at the center of the collector 12. The lenses 16*a* to 16*e* all have a focal length to be able to focus the solar energy to the center of the collector 12 to the solar cell array 18 and heat exchanger tube array 20. While the preferred embodiment is illustrated with showing five lens elements, there may more than five lens elements and are not ruled out. The length of the longitudinal lenses 16*a* to 16*e* may be different for different application as described later.

The solar cell panels of the solar cell array 18 are also five in number and are in the same semi-circular arrangement as the lenses, so that each longitudinal lens would focus the light and heat to the corresponding solar panel.

However, this does not preclude the same solar cell panel from receiving light and heat from other lenses, adjacent to this one lens. Also this does not preclude a solar cell panel from receiving light and heat from all other lenses. The amount of light and heat received by each of the five solar cell panels would vary as the sun travels from east to west.

With reference to FIG. 1, as a simplified illustration, for a morning sun, lenses 16*a*, 16*b*, and 16*c* would focus light and heat on the three corresponding solar panels parallel to these lenses. The solar cell panels that are parallel to the lenses 16*d* and 16*e* would receive only diffused light and heat. For a mid-day sun, lenses 16*b*, 16*c*, and 16*d* would focus light and heat on the three corresponding solar panels parallel to these lenses. The solar cell panels that are parallel to the lenses 16*a* and 16*e* would receive only diffused light and heat. For an afternoon sun, lenses 16*c*, 16*d*, and 16*e* would focus light and heat on the three corresponding solar panels parallel to these lenses. The solar cell panels that are parallel to the lenses 16*a* and 16*b* would receive only diffused light and heat. Therefore all five solar panels receive light and heat energy in different proportions as the sun travels from east to west.

Further the semi circular structure of the collector 12, it is believed helps in trapping light and heat in the structure for maximum utilization of the solar energy by the energy collector 12. The semi-circular structure of collector 12 may also have removable or hinged cover panels at the two ends (not shown), with reflective coating on the inside surfaces of the cover panels to help retain heat and light inside the structure, as well as to provide access for maintenance.

As illustrated in FIG. 2A, the width 53 and depth 52 of the solar energy collector 12 may be used that is suitable for different applications. For a light pole or outdoor communication equipment application, the width of the lens element 16*c* may be 6 inches, and the width 53 of collector 12 may be one feet and the length 52 may be two feet. For placing a farm of solar collectors 12 around the open spaces of a building or on the roof of a building, the width of the lens element 16*c* may be 12 inches, and the width 53 of collector 12 may be two feet and the length 52 may be four to six feet.

For placing a farm of solar collectors 12 in an open field away from urban areas, the width of the lens element 16*c* may be 24 inches, and the width 53 of collector 12 may be 4 feet and the length 52 may be 12 feet. There is no limitation on the length 52 of the collector 12 and many such collectors may be placed side by side that may provide for an equivalent length of a few hundred feet.

These lenses 16 may be made of light weight clear plastic that would be suitable for such lenses. Glass lenses may not be preferred due their weight. It is believed, larger lenses then 24 inch wide may not be preferred due to the weight and cost of producing such large longitudinal lenses. However, it is to be appreciated that there is no limitation on the size of such lenses, if such larger lenses can be produced and used cost effectively for the energy collector 12.

As shown in FIG. 3A, as a simplified illustration, a perspective view 58 shows a lens element 16, the solar cell assembly 18 below the lens 16 and the rays of the sun focusing lengthwise on the solar cell array as focused strip beam 17.

As illustrated with side views 54, 55 and 56 of the perspective view 58, as the sun travels across the sky the rays of the sun hit the solar cell array at different angles. The movement of the sun across the sky from east to west has both an elevation angle and an azimuth angle. It is believed, no matter which angle the rays of the sun hit the lens, the focused light strip beam 17*a* in view 55, 17*b* in view 54 and 17*c* in view 56 falls on different parts of the solar cell assembly 18, enabling the solar cell assembly 18 to receive solar energy from all positions of the sun as the sun travels across the sky from east to west.

As illustrated in view 54, the focal length 19 of the lens 16 is from the center of the lens to a location near the center of the collector 12 under the solar cell array 18. Choosing such a focal length 19 of the lens 16 avoids a single line sharp focus of the solar radiation that would cause the single line intense heat to damage the solar cells of the solar array 18. Instead a focal length 19 of the lens 16 and placement and size of the solar cell array 18 is such that the light would be focused as strip 17 on the solar panels of the solar array 18.

As a simplified illustration, for a width of the lens 16 of 2 feet, the corresponding width of the solar array panel directly underneath the lens 16, it is believed may be six inches wide. The longitudinal length of the solar cell panel would be the same as the longitudinal length of the lens 16. As a simplified illustration, such a solar energy collector 12 structure would require 400% fewer solar cells as compared to using flat solar cell panels directly exposed to the sun as in prior art.

As shown in FIG. 3B, the perspective view 58 shows a lens element 16, the solar cell assembly 18 below the lens 16 and the rays of the sun focusing lengthwise on the solar cell array as focused beam 17 with heat energy collecting elements 20 under the solar cell array 18. The heat energy array may be made from five tubes, each tube placed close to the corresponding solar cell array. Or there may be a single tube in the center to collect and channel heat energy. The heat energy may be channeled out of the collector 12 in many different ways. One prior art way is using a fluid and pipe system to a heat exchanger. The heat exchanger would be on the ground. Alternatively, there may be different ways to convert heat to electrical energy right in the collector 12 itself and are not ruled out.

As the sun travels across the sky the rays of the sun hit the solar cell array 18 and thus the heat array 20 at different angles. No matter which angle they hit the lens, the focused light beam 17 falls on different parts of the solar cell assembly, 17a, 17b and 17c respectively, enabling the solar cell assembly to receive solar heat energy from all position of the sun as the sun travels across the sky from east to west into the heat collecting assembly 20 under the solar cell array 18.

As shown in FIG. 3A-B, the lens 16 focuses light as a focused strip of light 17 on the solar array 18. As the sun travels the rays of the sun would be at angles other than right angles, and would still focus the light to a beam strip 17.

Triple Energy Collector Farm 11

Figure 4:
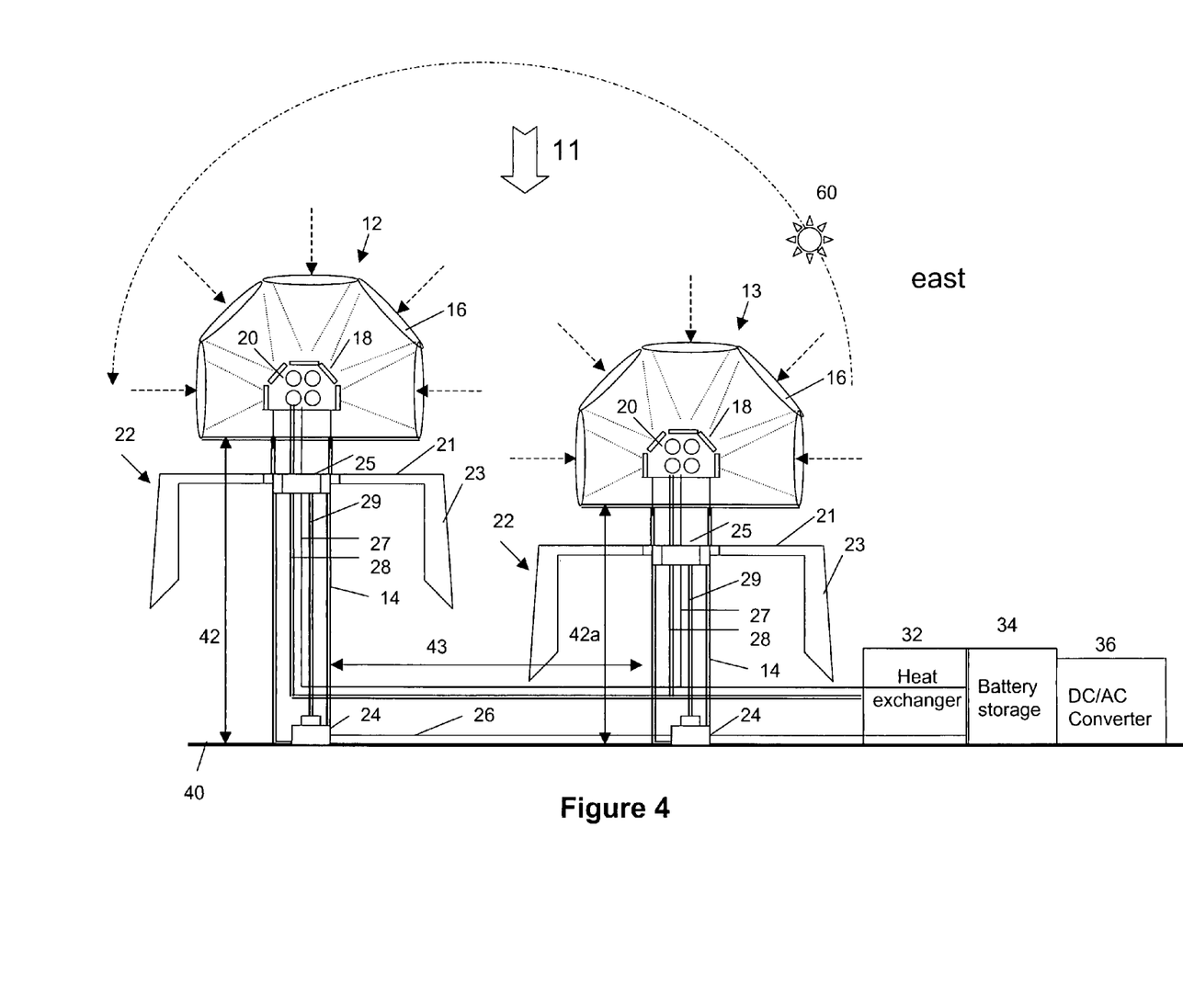
FIG. 4: A solar and wind energy farm that harnesses both solar energy and wind energy using solar energy collectors mounted on poles and wind turbines rotating horizontally on the same poles.

As shown in FIG. 4, a wind energy collector turbine 22 with an electric generator 24 inside the pole 14 at the bottom of the pole 14 may be made part of the energy collector 12. The energy from the wind would be transmitted from the generator 24 via wire means 26 to the battery system 34.

The wind turbine 22 mounted and rotating in a horizontal axis on the pole 14 may have any design of blade 23 in the vertical plane to maximize the catching of the flowing wind energy. This is in contrast to the prior art traditional wind mills which rotate vertically and occupy a large space to harness wind energy.

As illustrated in FIG. 4, in the embodiments here, the wind turbine 22 may have vertical blades 23 that rotate in a horizontal axis to minimize the space required on an energy collector such as collector 12 that also simultaneously harnesses solar energy. As a simplified illustration of the blades 23 rotating in a horizontal axis, each of the three blades of a prior art windmill turbine rotating in a vertical plane may be hung vertically from three separate horizontally positioned support members 21 that are equally spaced around a circle (not shown). The three horizontal members 21 are anchored to a horizontal circular member 25 that rotates in the horizontal plane. Each of the three blades 23 is angled on the horizontal support member 21 to present the same angle to the wind vector as the three blades of a prior art windmill. As shown in FIG. 4, the wind turbine 22 has horizontal members 21 and vertical hung blades 23 that rotate around the ring 25 and drive a vertical shaft 29 that drives the generator 24 at the base of the pole 14.

As illustrated in FIG. 5, an energy farm may have multiple solar collectors 12 and 13 on poles 14 oriented to face the east sun and using central battery storage 34 and a central heat exchanger system 32 that farms energy from all the collectors 12 and 13 in the energy farm 11.

A solar energy system 10 has a solar energy collector 12 that has a semi-circular elongated structure with multiple lens elements on the surface of the structure that focus solar radiation near towards the center of the structure to therein positioned grid of photo-voltaic cell element array 18 that convert light radiation to electrical energy. The energy collector 12 has the orientation such that the lens elements on the surface of the semi-circular elongated structure face the sun, as the sun travels from east to west, to focus solar energy towards the center of the structure to the solar cell elements.

The solar energy collector 12 has a wire transmit means to transmit the electrical energy out of the structure for storage in a battery storage system 34. The solar collector 12 is mounted on a pole 14, where the electrical energy through the wire means running inside the pole is sent to a battery storage system 34.

The solar energy farm 10 would have multiple solar collectors 12 on the poles that are arranged in a pattern of an energy farm, where the multiple solar collectors feed the same battery system 34.

The solar energy collector 12 also may have a wind turbine at the bottom of the structure and mounted on the pole coupled with an electrical generator to collect wind energy, convert to electrical energy and feed to the same battery system 34.

The solar energy collector 12 has a heat energy collecting element 20 at the center of the solar collector that collects heat energy by heating a fluid. The heated fluid is circulated to a heat exchanger 32 to extract heat energy. The heated fluid is used to drive a generator to generate electricity or may be used for other purposes.

In the solar energy system 10 that has the solar energy collector 12, the collector 12 is used in one of the configurations of (i) on top of a building, (ii) on ground around the space of a building in urban areas, and (iii) in an open space in a field away from urban areas.

The solar energy system 10 has the solar energy collector 12 that is used in one of the configurations of (i) on top of a pole to feed energy to a street light system, (ii) on top of a pole to feed standalone communication equipment and (iii) on top of pole for beacon lights.

A system 11 that harnesses energy from the environment has a collector 12 that harnesses solar light radiation, solar heat radiation, and harnesses wind energy. The collector 12 harnesses wind energy by a horizontal axis rotation wind turbine 221. The collector 12 harnesses solar light radiation by using a system of lenses that focus light towards the center to the photovoltaic cell array 18. The collector 12 harnesses solar heat radiation by using a system of lenses that focus heat towards the center to a heat exchanger array 20.

Figure 2B:
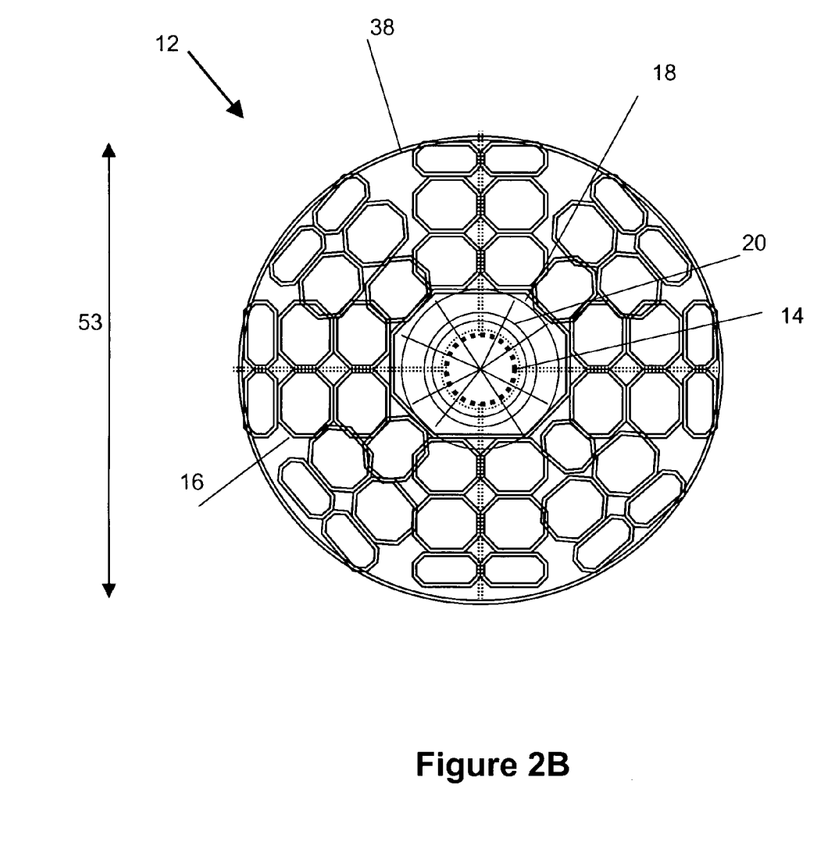
FIG. 2B: Structure details of a semi-spherical solar energy collector.

In another embodiment, as illustrated in FIG. 2B, a solar energy system may have a solar energy collector 12 that has a semi-spherical geodesic dome structure with multiple lens elements 16 on the surface of the structure that focus solar radiation near towards the center of the structure to therein positioned grid of photo-voltaic cell elements 18 that convert light radiation to electrical energy and a system tubes 20 that harnesses heat energy. The dome structure has support structure 38 with the help of a pole 14 that holds the lenses 16, the solar cell array 18, and the heat exchanger element 20 in position in relation to each other. The diameter 53 of the dome structure can be limited to a maximum size and may be as small as a few feet and as large as 10 feet for use in different application as described earlier. Other sizes may also be practical if they can be efficiently made and installed.

The solar energy collector 12 has a wire transmit means to transmit the electrical energy out of the structure for storage in a battery storage system 34. The solar energy collector 12 is mounted on a pole 14, where the electrical energy through the wire means running inside the pole is sent to a battery storage system 34.

A solar energy farm 11 would have multiple solar collectors 12 and 13 on the poles 14 are arranged in a pattern of an energy farm, the multiple solar collectors feed the same battery system 34.

The solar energy collector 12 has a wind turbine at the bottom of the structure and mounted on the pole 14 rotating in a horizontal plane, coupled with an electrical generator 24 to harness wind energy for conversion to electrical energy and feed the same battery system 34.

The solar energy collector 12 has a heat energy collecting element 20 at the center of the solar collector that collects heat energy by heating a fluid.

In an alternative embodiment, the structure of the solar collector 12 may be semi-spherical geodesic dome with the surface of the dome studded with lenses that focus solar energy towards the center of the geodesic dome.

A solar energy system has a solar energy collector that has a geodesic dome structure with multiple lens elements on the surface of the structure that focus solar radiation near towards the center of the structure to therein positioned grid of photo-voltaic cell elements that convert light radiation to electrical energy.

The solar energy collector has a wire transmit means to transmit the electrical energy out of the structure for storage in a battery storage system. The solar energy collector is mounted on a pole, where the electrical energy through the wire means running inside the pole is sent to a battery storage system. The solar energy farm has multiple solar collectors on the poles are arranged in a pattern of an energy farm, the multiple solar collectors feed the same battery system.

The solar energy collector may have a wind turbine at the bottom of the structure and mounted on the pole rotating in a horizontal plane, coupled with an electrical generator to collect wind energy, convert to electrical energy and feed to the same wire means. The solar energy collector may also have a heat energy collecting element at the center of the solar collector that collects heat energy by heating a fluid.

In summary, the solar energy system 10 enables harnessing of the solar energy and energy system 11 enable harnessing of solar energy and wind energy in this triple energy farm. The systems 10 and 11 use a solar collector 12 using longitudinal lenses that concentrate both the solar light and solar heat energy towards the center of the collector for efficient harnessing of these two forms of solar energy. System 11 has an integrated wind energy collector in the form a wind turbine that is integrated into the solar energy collector of system 10 to provide an integrated system for harnessing solar and wind energies.

While the particular apparatus 10 and 11 as illustrated herein and disclosed in detail is fully capable of obtaining the objective and providing the advantages herein before stated, it is to be understood that it is merely illustrative of the presently preferred embodiments of the invention and that no limitations are intended to the details of construction or design herein shown other than as described in the appended claims.

What is claimed is:

1. A solar energy system, comprising:
   a. a solar energy collector having substantially a semi-circular elongated structure with multiple longitudinal convex lens elements on a surface of the structure that focus solar radiation towards the center of the structure to therein positioned a grid of photo-voltaic cell elements that convert light radiation to electrical energy; and
   b. the energy collector has an orientation such that the lens elements on the surface of the semi-circular elongated structure face the sun, as the sun travels from east to west, to focus solar energy radiation towards the center of the structure to the photo-voltaic cell elements and the energy collector is fixed in position and receives solar energy from different positions of the sun as the sun moves in the sky without the structure being moved to track the sun.

2. The solar energy collector as in claim 1, further comprising:
   a wire used to transmit the electrical energy out of the structure for storage in a battery storage system.

3. The solar energy collector as in claim 2, further comprising:
   the solar collector is mounted on a pole, where the electrical energy through the wire means running inside the pole is sent to a battery storage system.

4. The solar energy collector as in claim 3, further comprising:
   multiple solar collectors on the poles are arranged in a pattern of an energy farm, the multiple solar collectors feed the same battery system.

5. The solar energy collector as in claim 3, further comprising:
   a wind turbine positioned below the structure and mounted on the pole, the blades of the turbine rotating in a horizontal plane;
   the blades are rigidly coupled with a circular member rotating around a vertical shaft to drive an electrical generator to harness wind energy as converted to electrical energy.

6. The solar energy collector as in claim 1, further comprising:
   a heat energy collecting element at the center of the solar collector that collects heat energy by heating a fluid.

7. The solar energy collector as in claim 6, wherein:
   the heated fluid is circulated to a heat exchanger to extract heat energy.

8. The solar energy collector as in claim 6, wherein:
   the heated fluid is used to drive a generator to generate electricity.

9. The solar energy collector as in claim 1, wherein:
   the solar energy collector is mounted on a pole and is used in one of the configurations of (i) on top of a building, (ii) on ground around the space of a building in urban areas, and (iii) in an open space in a field away from urban areas.

10. The solar energy collector as in claim 1, wherein:
    the solar energy collector is used in one of the configurations of (i) on top of a pole to feed energy to a street light system, (ii) on top of a pole to feed standalone communication equipment and (iii) on top of pole for beacon lights.

11. A system that harnesses energy from the environment, comprising:
    an energy collector that harnesses solar light radiation, solar heat radiation, and also energy from the wind, has a structure with a substantially semi spherical surface, the surface studded with a grid of convex lenses on the surface that direct energy to a center of the structure;
    the collector is mounted on a pole for use on roofs of building, open spaces around buildings in urban areas and open spaces and where the energy collector is fixed in position and receives solar energy from different positions of the sun as the sun moves in the sky without the structure being moved to track the sun.

12. The system, as in claim 11, further comprising:
    the collector harnesses wind energy by a horizontal axis rotation wind turbine.

13. The system, as in claim 11, further comprising:

the collector harnesses solar light radiation by using the grid of convex lenses that focus light to the center to the photovoltaic cells.

14. The system, as in claim 11, further comprising:

the collector harnesses solar heat radiation by using the grid of lenses that focus heat to the center to a heat exchanger.

15. A solar energy system, comprising:

a solar energy collector having a geodesic dome structure with multiple convex lens elements on the surface of the structure that focus solar radiation towards the center of the structure to therein positioned grid of photo-voltaic cell elements that convert light radiation to electrical energy;

the energy collector is fixed in position and receives solar energy from different positions of the sun as the sun moves in the sky without the structure being moved to track the sun.

16. The solar energy collector as in claim 15, further comprising:

a wire is used to transmit the electrical energy out of the structure for storage in a battery storage system.

17. The solar energy collector as in claim 16, further comprising:

the solar collector is mounted on a pole, where the electrical energy through the wire running inside the pole is sent to a battery storage system.

18. The solar energy collector as in claim 17, further comprising:

multiple solar collectors on the poles are arranged in a pattern of an energy farm, the multiple solar collectors feed the same battery system.

19. The solar energy collector as in claim 17, further comprising:

an air vane at the bottom of the structure and mounted on the pole rotating in a horizontal plane, coupled with an electrical generator to collect wind energy, convert to electrical energy and feed to the same wire.

20. The solar energy collector as in claim 1, further comprising:

a heat energy collecting element at the center of the solar collector that collects heat energy by heating a fluid.

\* \* \* \* \*